United States Patent
Mitsuyama et al.

(10) Patent No.: US 11,143,710 B2
(45) Date of Patent: Oct. 12, 2021

(54) DEVICE FOR ESTIMATING DEGRADATION OF SECONDARY CELL, AND METHOD FOR ESTIMATING DEGRADATION OF SECONDARY CELL

(71) Applicants: FURUKAWA ELECTRIC CO., LTD., Tokyo (JP); FURUKAWA AUTOMOTIVE SYSTEMS INC., Shiga (JP)

(72) Inventors: Taiji Mitsuyama, Tokyo (JP); Etsuzo Sato, Tokyo (JP); Noriyasu Iwane, Tokyo (JP); Naotaka Uchino, Tokyo (JP); Hirokazu Narui, Tokyo (JP); Akira Oono, Tokyo (JP); Takayuki Morikawa, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 334 days.

(21) Appl. No.: 16/145,007

(22) Filed: Sep. 27, 2018

(65) Prior Publication Data
US 2019/0033392 A1 Jan. 31, 2019

Related U.S. Application Data

(63) Continuation of application No. PCT/JP2017/012776, filed on Mar. 28, 2017.

(30) Foreign Application Priority Data

Mar. 29, 2016 (JP) .............................. JP2016-066621

(51) Int. Cl.
*G01R 31/392* (2019.01)
*H01M 10/48* (2006.01)
(Continued)

(52) U.S. Cl.
CPC ........... *G01R 31/392* (2019.01); *G01R 31/36* (2013.01); *G01R 31/389* (2019.01); *G01R 31/396* (2019.01); *H01M 10/48* (2013.01)

(58) Field of Classification Search
CPC .... G01R 31/392; G01R 31/36; G01R 31/389; G01R 31/396; H01M 10/48; Y02E 60/10
See application file for complete search history.

(56) References Cited

U.S. PATENT DOCUMENTS 8,719,195 B2    5/2014    Frisch et al.
9,312,722 B2    4/2016    Lee
(Continued)

FOREIGN PATENT DOCUMENTS

CN    101512365 A    8/2009
CN    101641606 A    2/2010
(Continued)

OTHER PUBLICATIONS

International Search Report for PCT Application No. PCT/JP2017/012776, dated Jul. 4, 2017, 5 pages.
(Continued)

*Primary Examiner* — Tarun Sinha
*Assistant Examiner* — Lal C Mang
(74) *Attorney, Agent, or Firm* — Amin, Turocy & Watson, LLP

(57) ABSTRACT

A secondary battery deterioration estimation device includes receiving a first signal representing a discharging voltage; receiving a second signal representing a discharging current from a current sensor; calculating values of elements forming an equivalent circuit of the secondary battery based on the first and second signals; calculating a state of health (SOH) of the secondary battery based on the values of the elements forming the equivalent circuit; generating history information showing history of a use state of the secondary
(Continued)

battery; calculating the SOH of the secondary battery based on the history information; determining a deterioration state of the secondary battery with reference to at least one of the SOH calculated by the values of the elements or the SOH calculated by the history information by the processor in accordance with a state of the secondary battery; and outputting data representing the deterioration state of the secondary battery.

20 Claims, 9 Drawing Sheets

(51) Int. Cl.
  *G01R 31/36* (2020.01)
  *G01R 31/389* (2019.01)
  *G01R 31/396* (2019.01)

(56) References Cited

U.S. PATENT DOCUMENTS

| | | | |
|---|---|---|---|
| 9,678,164 | B2 | 6/2017 | Mitsuyama et al. |
| 2008/0054848 | A1 | 3/2008 | Yun et al. |
| 2009/0276172 | A1 | 11/2009 | Nishi |
| 2010/0153038 | A1 | 6/2010 | Tomura et al. |
| 2011/0084702 | A1 | 4/2011 | Mori |
| 2011/0161025 | A1 | 6/2011 | Tomura et al. |
| 2012/0007556 | A1 | 1/2012 | Matsui et al. |
| 2013/0027047 | A1 | 1/2013 | Yoshioka et al. |
| 2013/0030736 | A1 | 1/2013 | Tanaka |
| 2013/0091083 | A1 | 4/2013 | Frisch et al. |
| 2013/0110429 | A1* | 5/2013 | Mitsuyama .......... G01R 31/367 702/63 |
| 2013/0320989 | A1 | 12/2013 | Inoue et al. |
| 2014/0333265 | A1 | 11/2014 | Kinjo et al. |
| 2015/0127281 | A1 | 5/2015 | Kusano et al. |
| 2015/0326038 | A1 | 11/2015 | Lee |
| 2015/0377978 | A1 | 12/2015 | Mitsuyama et al. |
| 2016/0052419 | A1 | 2/2016 | Takahashi et al. |

FOREIGN PATENT DOCUMENTS

| | | |
|---|---|---|
| CN | 102043132 A | 5/2011 |
| CN | 102144169 A | 8/2011 |
| CN | 102183730 A | 9/2011 |
| CN | 102901928 A | 1/2013 |
| CN | 102918411 A | 2/2013 |
| CN | 103035961 A | 4/2013 |
| CN | 105026944 A | 11/2015 |
| CN | 105098869 A | 11/2015 |
| CN | 105190985 A | 12/2015 |
| JP | 2005221487 A | 8/2005 |
| JP | 2007187534 A | 7/2007 |
| JP | 2008-058278 A | 3/2008 |
| JP | 2009145065 A | 7/2009 |
| JP | 2011106952 A | 6/2011 |
| JP | 2011-214843 A | 10/2011 |
| JP | 2013057537 A | 3/2013 |
| JP | 2014-105995 A | 6/2014 |
| JP | 2015-090342 A | 5/2015 |
| JP | 2015141117 A | 8/2015 |
| JP | 5862836 B2 | 2/2016 |
| WO | 2011118080 A1 | 9/2011 |
| WO | 2014-080764 A1 | 5/2014 |

OTHER PUBLICATIONS

Extended European Search Report issued in the EP Patent Application No. EP17775159.1, dated Apr. 11, 2019.
Office Action issued in the CN Patent Application No. 201780020722.5, dated Apr. 26, 2020, 23 pages (with translation).
Non-Final Office Action received for U.S. Appl. No. 16/144,985 dated Oct. 9, 2020, 51 pages.
Office Action issued in the CN Patent Application No. 201780020780.8, dated Apr. 2, 2020, 19 pages (with translation).
Extended European Search Report issued in the EP Patent Application No. EP17775158.3, dated Apr. 1, 2019.
International Search Report for PCT Application No. PCT/JP2017/012775, dated Jun. 20, 2017, 5 pages.
Notice of Reasons for Refusal received for Japanese Patent Application Serial No. 2016-066620 dated Aug. 8, 2019, 9 pages.
Office Action issued in CN Patent Application No. 201780020722.5, dated Jan. 14, 2021, 23 pages (with translation).
Office Action dated Feb. 22, 2021 for U.S. Appl. No. 16/144,985, 50 pages.

* cited by examiner

| FIRST PARAMETER GROUP | WEIGHTING COEFFICIENT | SECOND PARAMETER GROUP | | | | | |
|---|---|---|---|---|---|---|---|
| | | STATE OF CHARGE SOC | TEMPERATURE OF BATTERY $T\_batt$ | TEMPERATURE DIFFERENCE $\Delta T$ | QUANTITY OF STRATIFICATION $q\_st$ | QUANTITY OF POLARIZATION $q\_ov$ | CURRENT CHANGE RATE $\Delta I$ PER TIME |
| RUNNING TIME $t\_run$ | w1 | $A=a(SOC, t\_batt, \Delta T, q\_st, q\_ov, \Delta I)$ | | | | | |
| STOP TIME $t\_stop$ | w2 | $B=b(SOC, t\_batt, \Delta T, q\_st, q\_ov, \Delta I)$ | | | | | |
| CHARGE TIME $t\_chg$ | w3 | $C=c(SOC, t\_batt, \Delta T, q\_st, q\_ov, \Delta I)$ | | | | | |
| DISCHARGE TIME $t\_dischg$ | w4 | $D=d(SOC, t\_batt, \Delta T, q\_st, q\_ov, \Delta I)$ | | | | | |
| CHARGE AMOUNT $Ah\_chg$ | w5 | $E=e(SOC, t\_batt, \Delta T, q\_st, q\_ov, \Delta I)$ | | | | | |
| DISCHARGE AMOUNT $Ah\_dischg$ | w6 | $F=f(SOC, t\_batt, \Delta T, q\_st, q\_ov, \Delta I)$ | | | | | |
| INTERNAL RESISTANCE R | w7 | $G=g(SOC, t\_batt, \Delta T, q\_st, q\_ov, \Delta I)$ | | | | | |
| DECREASED MASS OF SOLUTION $d\_mass$ | w8 | $H=h(SOC, t\_batt, \Delta T, q\_st, q\_ov, \Delta I)$ | | | | | |

FIG.5

DEVICE FOR ESTIMATING DEGRADATION OF SECONDARY CELL, AND METHOD FOR ESTIMATING DEGRADATION OF SECONDARY CELL

CROSS-REFERENCE TO RELATED APPLICATIONS

This application is a continuation of, and claims priority to each of, international Patent Cooperation Treaty (PCT) Application No. PCT/JP2017/012776, filed Mar. 28, 2017, and entitled "DEVICE FOR ESTIMATING DEGRADATION OF SECONDARY CELL, AND METHOD FOR ESTIMATING DEGRADATION OF SECONDARY CELL," which claims priority to Japanese Patent Application No. 2016-066621, filed on Mar. 29, 2016, the entireties of each of which applications are hereby incorporated by reference herein in their entireties.

TECHNICAL FIELD

The present invention relates to a secondary battery deterioration estimation device and a secondary battery deterioration estimation method.

BACKGROUND ART

Conventionally, there have been proposed arts to estimate a deterioration state of a secondary battery. For example, in the art disclosed in Patent Document 1, the deterioration state is estimated based on a use history of the secondary battery.

In the arts disclosed in Patent Documents 2, 3, an internal resistance or an equivalent circuit of the secondary battery is used, and a change from an initial value of each of the above is detected to estimate the deterioration of the secondary battery.

RELATED ART DOCUMENT

Patent Document

Patent Document 1: Japanese Patent Application Laid-open No. 2015-141117
Patent Document 2: Japanese Patent Application Laid-open No. 2005-221487
Patent Document 3: Japanese Patent Application Laid-open No. 2007-187534

SUMMARY OF INVENTION

In the art disclosed in Patent Document 1, when a kind of the secondary battery to be a target of the deterioration estimation is fixed without being changed, the deterioration state can be estimated with relatively high accuracy. However, for example, when the secondary battery which is mounted on an automobile or the like is the estimation target, there is a case when the secondary battery which is different from an initial kind may be mounted. In such a case, there is a problem that the estimation accuracy decreases.

Meanwhile, since the change from the initial value is detected in the arts disclosed in Patent Documents 2, 3, the deterioration state can be estimated even when the kind of the secondary battery to be the estimation target changes. However, according to the arts disclosed in Patent Documents 2, 3, when the secondary battery is formed by serially arranging a plurality of unit electrochemical cells, variation in a degree of deterioration occurs among respective unit electrochemical cells. In such a case, though the deterioration state is controlled by the unit cell which is the most deteriorated, only the internal resistance and the equivalent circuit components of a whole of the plurality of cells can be measured as the internal resistance and the equivalent circuit components of the secondary battery. Accordingly, there is a problem that the deterioration state cannot be accurately estimated when there is a variation in deterioration.

The present invention is made in consideration of the aforementioned circumstances, and an object of the present invention is to provide a secondary battery deterioration estimation device and a secondary battery deterioration estimation method capable of accurately estimating deterioration of various kinds of secondary batteries, and accurately estimating deterioration regardless of states of the secondary battery.

Means for Solving the Problems

To solve the aforementioned problems, the present invention is characterized in that a secondary battery deterioration estimation device estimating deterioration of a secondary battery, includes: a memory; and a processor which executes the following processes based on executable programs stored in the memory, receiving a first signal representing a discharging voltage from a voltage sensor; receiving a second signal representing a discharging current from a current sensor; calculating values of elements forming an equivalent circuit of the secondary battery based on the first and second signals; calculating a state of health (SOH) of the secondary battery based on the values of the elements forming the equivalent circuit; generating history information showing history of a use state of the secondary battery; calculating the SOH of the secondary battery based on the history information; determining a deterioration state of the secondary battery with reference to at least one of the SOH calculated by the values of the elements or the SOH calculated by the history information by the processor in accordance with a state of the secondary battery; and outputting data representing the deterioration state of the secondary battery.

Such a configuration makes it possible to accurately estimate the deterioration of various kinds of secondary batteries, and to accurately estimate the deterioration regardless of the states of the secondary battery.

The present invention is characterized in that the processor determines the deterioration state of the secondary battery with reference to either one of the SOH calculated by the values of the elements or the SOH calculated by the history information, and switches the SOH to be referred to in accordance with the state of the secondary battery.

Such a configuration makes it possible to accurately detect deterioration irrespective of the state of the secondary battery by switching the SOH calculated by different methods according to the state of the secondary battery.

The present invention is characterized in that the processor determines the deterioration state of the secondary battery with reference to the SOH calculated by the values of the elements when the secondary battery is a new article, and the SOH calculated by the history information when the secondary battery deteriorates.

Such a configuration makes it possible to improve estimation accuracy by estimating deterioration based on the equivalent circuit when deterioration does not proceed, and estimating deterioration based on the use history when the deterioration proceeds.

The present invention is characterized in that the processor selects the SOH calculated by the history information as a reference destination when it is determined that the secondary battery deteriorates based on the values of the elements forming the equivalent circuit or the history information.

Such a configuration makes it possible to reliably estimate the deterioration state of the secondary battery based on the equivalent circuit component or history information and select the optimal SOH based on the estimation result.

The present invention is characterized in that the processor switches the reference destination from the SOH calculated by the values of the elements to the SOH calculated by the history information when it is determined that there is a variation in deterioration among cells of the secondary battery.

Such a configuration makes it possible to estimate the deterioration accurately based on the equivalent circuit even when the variation in the deterioration between the cells occurs in which the estimation accuracy drops greatly.

The present invention is characterized in that the processor determines the deterioration state of the secondary battery through correction of the SOH calculated by the values of the elements with the SOH calculated by the history information.

Such a configuration makes it possible to improve the estimation accuracy of the degradation regardless of the state of the secondary battery by performing complementary estimation by SOH obtained by two calculation methods.

The present invention is characterized in that the processor corrects the SOH calculated by the values of the elements based on the SOH calculated by the history information when it is determined that the secondary battery deteriorates based on the SOH calculated by the values of the elements.

Such a configuration makes it possible to improve the estimation accuracy of the degradation by performing complementary estimation based on two estimation means when it is determined that the secondary battery is deteriorated based on the value of the element.

The present invention is characterized in that the processor generates information showing charge and discharge of the secondary battery based on a signal from a current sensor which detects a current flowing through the secondary battery, and calculates the SOH based on the generated history information.

Such a configuration makes it possible to accurately estimate the deterioration state of the secondary battery based on the state of charge and discharge of the secondary battery.

The present invention is characterized in that the secondary battery is mounted on a vehicle, and the processor further detects a running time and a stop time of the vehicle, generates the history information with reference to the detected running time and stop time, and calculates the SOH based on the generated history information.

Such a configuration makes it possible to accurately estimate the deteriorated state of the secondary battery in consideration of the running state of the vehicle.

The present invention is characterized in that the processor further detects an internal resistance and a decreased mass of solution of the secondary battery, generates the history information with reference to the detected internal resistance and decreased mass of solution, and calculates the SOH based on the generated history information.

Such a configuration makes it possible to accurately estimate the degradation state of the secondary battery in consideration of the internal resistance and the amount of liquid loss of the secondary battery.

The present invention is characterized in that the secondary battery is mounted on a vehicle, and the processor detects and sets at least one of a running time and a stop time of the vehicle, and a charge time, a discharge time, a charge amount, a discharge amount, an internal resistance, and a decreased mass of solution of the secondary battery as a first parameter, detects and sets at least one of a state of charge, an internal temperature, a temperature difference between an environmental temperature and the internal temperature, a quantity of stratification, a quantity of polarization, and a current change rate per a unit time as a second parameter, calculates a correction coefficient based on the second parameter, corrects the first parameter by using the correction coefficient, multiplies the corrected first parameter by a weighting coefficient, and calculates the SOH based on the obtained value.

Such a configuration makes it possible to accurately estimate the deterioration state of the secondary battery based on the first parameter and the second parameter.

The present invention is characterized in that an output circuit which outputs warning when the value of the SOH obtained by the processor is smaller than a predetermined threshold value.

Such a configuration makes it possible to notify the user of the deterioration state of the secondary battery.

The present invention is characterized in that a secondary battery deterioration estimation method estimating deterioration of the secondary battery, to be performed by a programmable processor connected to a voltage sensor detecting a discharging voltage of the secondary battery and to a current sensor detecting a discharging current of the secondary battery, the method includes: receiving a first signal representing the discharging voltage from the voltage sensor; receiving a second signal representing the discharging current from the current sensor; calculating values of elements forming an equivalent circuit of the secondary battery based on the first and second signals; calculating a state of health (SOH) of the secondary battery based on the values of the elements forming the equivalent circuit; generating history information showing history of a use state of the secondary battery; calculating the SOH of the secondary battery based on the history information; determining a deterioration state of the secondary battery with reference to at least one of the SOH calculated by the values of the elements or the SOH calculated by the history information in accordance with a state of the secondary battery; and outputting data representing the deterioration state of the secondary battery.

Such a configuration makes it possible to accurately estimate the deterioration of various kinds of secondary batteries, and to accurately estimate the deterioration regardless of the states of the secondary battery.

The present invention is characterized in that a secondary battery deterioration estimation method estimating deterioration of the secondary battery, to be performed by a programmable processor connected to a voltage sensor detecting a discharging voltage of the secondary battery and to a current sensor detecting a discharging current of the secondary battery, the method includes: receiving a first signal representing the discharging voltage from the voltage sensor; receiving a second signal representing the discharging current from the current sensor; calculating values of elements forming an equivalent circuit of the secondary battery based on the first and second signals; calculating a state of health (SOH) of the secondary battery based on the values of the elements forming the equivalent circuit; generating history information showing history of a use state of the secondary battery; calculating the SOH of the secondary battery based on the history information; determining a deterioration state of the secondary battery with reference to at least one of the SOH calculated by the values of the elements or the SOH calculated by the history information in accordance with a state of the secondary battery; and outputting data representing the deterioration state of the secondary battery.

Such a method makes it possible to accurately estimate the deterioration of various kinds of secondary batteries, and to accurately estimate the deterioration regardless of the states of the secondary battery.

According to the present invention, it is possible to provide a secondary battery deterioration estimation device and a secondary battery deterioration estimation method capable of accurately estimating deterioration of various kinds of secondary batteries, and accurately estimating deterioration regardless of states of the secondary battery.

BRIEF DESCRIPTION OF DRAWINGS

FIG. 5 is a chart illustrating an example of a use history.

DESCRIPTION OF EMBODIMENTS

Next, an embodiment of the present invention will be described.

(A) Explanation of Configuration of Embodiment of Present Invention

Figure 1:
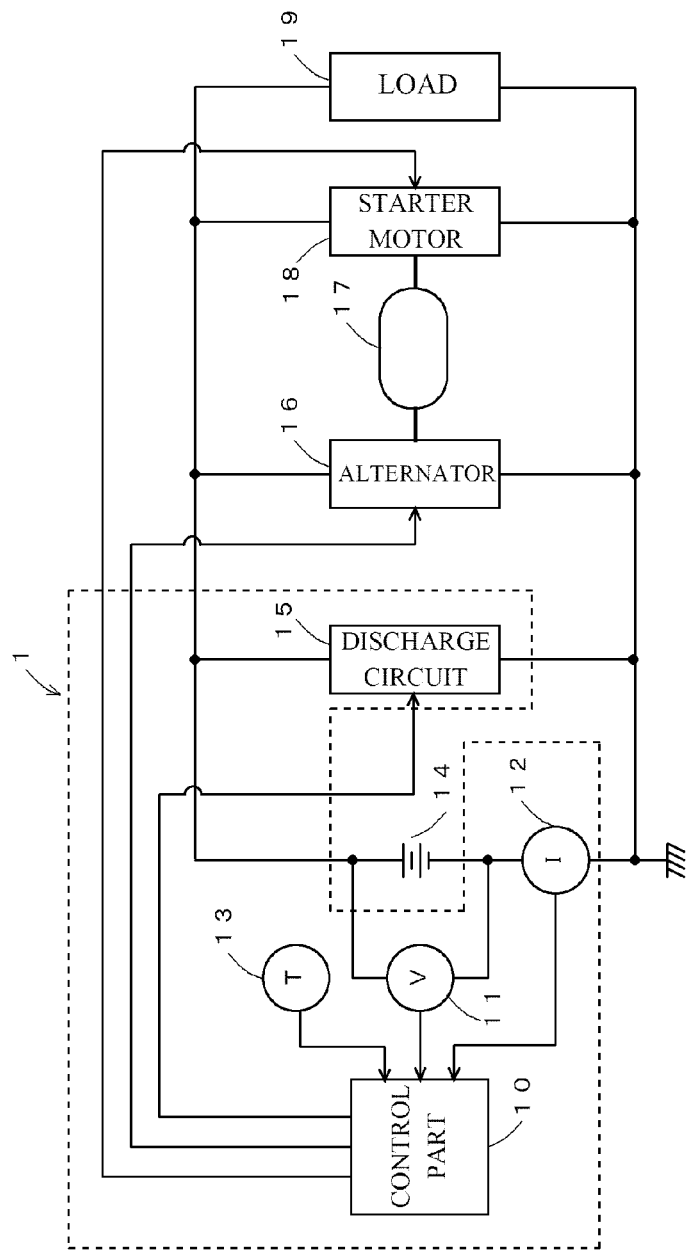
FIG. 1 is a diagram illustrating a configuration example of a secondary battery deterioration estimation device according to an embodiment of the present invention.

FIG. 1 is a diagram illustrating a power supply system of a vehicle having a secondary battery deterioration estimation device according to the embodiment of the present invention. In this drawing, a secondary battery deterioration estimation device 1 includes a control part 10, a voltage sensor 11, a current sensor 12, a temperature sensor 13, and a discharge circuit 15 as main constituent elements, and controls a charging state of a secondary battery 14. Here, the control part 10 controls the charging state of the secondary battery 14 by referring to outputs from the voltage sensor 11, the current sensor 12, and the temperature sensor 13 to detect the state of the secondary battery 14 and controlling a power generation voltage of an alternator 16. The voltage sensor 11 detects a terminal voltage of the secondary battery 14, and notifies the control part 10. The current sensor 12 detects a current flowing through the secondary battery 14, and notifies the control part 10. The temperature sensor 13 detects an environmental temperature of the secondary battery 14 in itself or a periphery thereof, and notifies the control part 10. The discharge circuit 15 is formed by, for example, a semiconductor switch, a resistance element, and so on which are seriously connected, and intermittently discharges the secondary battery 14 by the semiconductor switch which is on/off controlled by the control part 10.

The secondary battery 14 is formed by, for example, a lead-acid battery, a nickel-cadmium battery, a nickel hydride battery, a lithium ion battery, or the like, charged by the alternator 16, starts an engine by driving a starter motor 18, and supplies electric power to a load 19. The alternator 16 is driven by an engine 17, generates alternating-current power, and converts it into direct-current power by a rectifying circuit to charge the secondary battery 14. The alternator 16 is controlled by the control part 10, and is able to adjust the power generation voltage.

The engine 17 is formed by, for example, a reciprocal engine such as a gasoline engine and a diesel engine, or a rotary engine and the like, started by the starter motor 18, drives driving wheels through a transmission to supply propulsive force to a vehicle, and generates electric power by driving the alternator 16. The starter motor 18 is formed by, for example, a direct-current motor, generates rotational force by the electric power supplied from the secondary battery 14, and starts the engine 17. The load 19 is formed by, for example, an electric steering motor, a defogger, a sheet heater, an ignition coil, a car audio, a car navigation, and the like, and operated by the electric power from the secondary battery 14.

Figure 2:
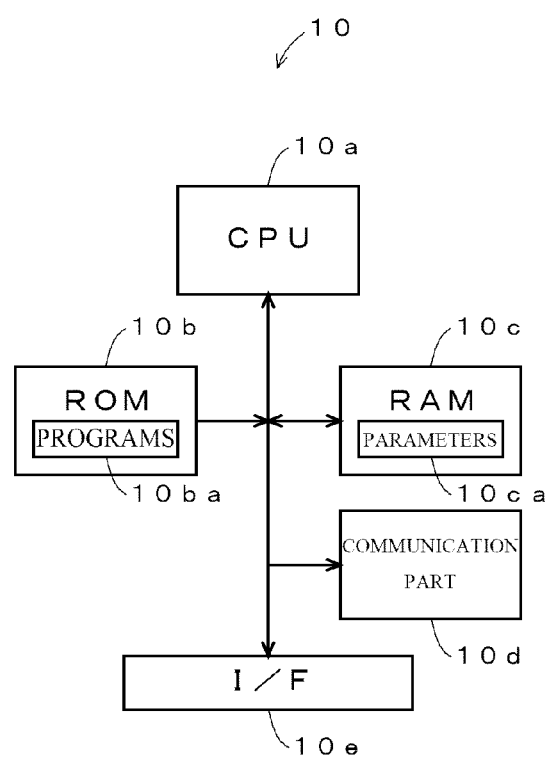
FIG. 2 is a block diagram illustrating a detailed configuration example of a control part in FIG. 1.

FIG. 2 is a diagram illustrating a detailed configuration example of the control part 10 illustrated in FIG. 1. As illustrated in this drawing, the control part 10 includes a CPU (central processing unit) 10a, a ROM (read-only memory) 10b, a RAM (random access memory) 10c, a communication part 10d, and an I/F (interface) 10e. Here, the CPU 10a controls each part based on programs 10ba stored in the ROM 10b. The ROM 10b is formed by a semiconductor memory or the like, and stores the programs 10ba and so on. The RAM 10c is formed by a semiconductor memory or the like, and stores data generated when the programs 10ba are executed and parameters 10ca such as later-described numerical expressions or tables. The communication part 10d performs communication with an ECU (electronic control unit) or the like being a higher device, and notifies the higher device of detected information or control information. The I/F 10e converts signals supplied from the voltage sensor 11, the current sensor 12, and the temperature sensor 13 into digital signals to take in, supplies a drive current to the discharge circuit 15, the alternator 16, the starter motor 18, and the like to control them.

In the example in FIG. 2, one CPU 10a is included, but distributed processing may be executed by using a plurality of CPUs. The control part 10 may be formed by a DSP (digital signal processor), an FPGA (field programmable gate array), an ASIC (application specific integrated circuit), and the like instead of the CPU. Processing may be performed by a general-purpose processor executing functions by reading software programs or a computer on a server through a cloud computing. In FIG. 2, the ROM 10b and the RAM 10c are included, but for example, a storage device other than the above (for example, an HDD (hard disk drive) being a magnetic storage device) may be used.

(B) Explanation of Operations of Embodiment of Present Invention

Next, operations of the embodiment of the present invention will be described. In the following, a principle of operation of the embodiment of the present invention is explained, and then detailed operations are explained.

Figure 3:
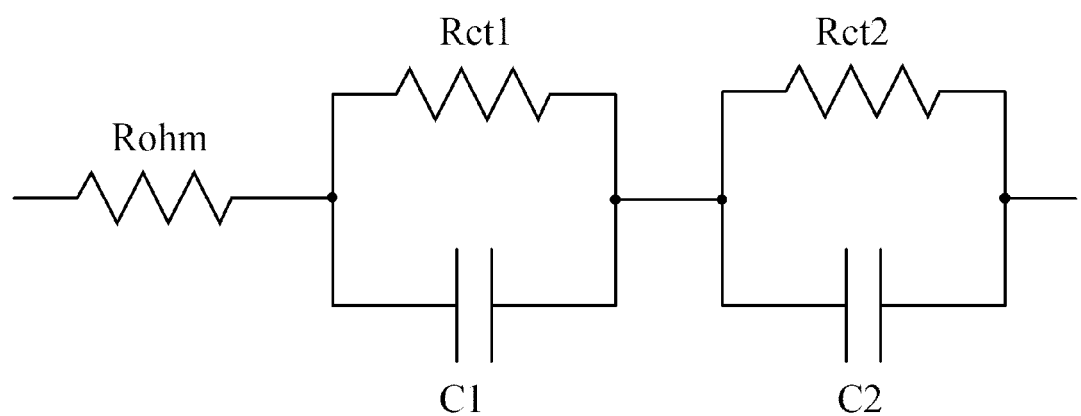
FIG. 3 is a diagram illustrating an example of an equivalent circuit of the secondary battery illustrated in FIG. 1.

First, the principle of operation of this embodiment is explained. In this embodiment, an equivalent circuit of the secondary battery 14 illustrated in FIG. 3 is found by, for example, fitting processing or learning processing, to find components of the equivalent circuit. In the example in FIG. 3, the equivalent circuit includes Rohm being a resistance component corresponding to a conductor element and an electrolytic solution resistance in the secondary battery 14, Rct1, Rct2 each being a resistance component corresponding to a reaction resistance of an active material reaction of an electrode, and C1, C2 each being a capacitive component corresponding to an electric double layer at an interface between the electrode and the electrolytic solution. Values of the resistance components increase and values of the capacitive components decrease in accordance with deterioration of the secondary battery 14. Accordingly, a SOH (state of health) of the secondary battery 14 is calculated by substituting equivalent circuit components found as stated above into an expression (1) shown below to estimate a deterioration state.

$$SOH = f(Rohm, Rct1, Rct2, C1, C2) \quad (1)$$

Deterioration estimation through the above-stated method has a characteristic capable of accurately estimating deterioration regardless of kinds of the secondary battery 14.

On the other hand, the deterioration estimation cannot be performed accurately through the above method when there is a variation in deterioration of cells forming the secondary battery 14.

Figure 4A:
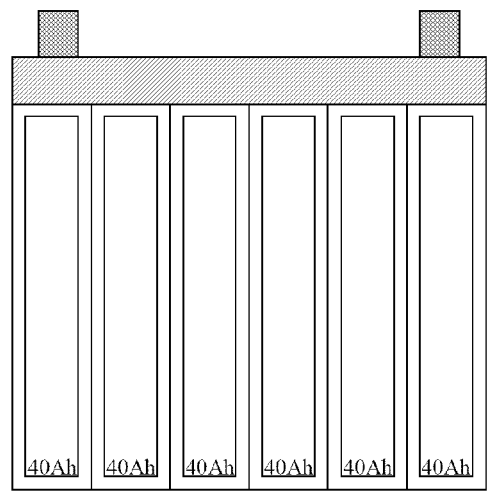
FIG. 4A is a diagram illustrating a progress state of deterioration of cells of the secondary battery.
Figure 4B:
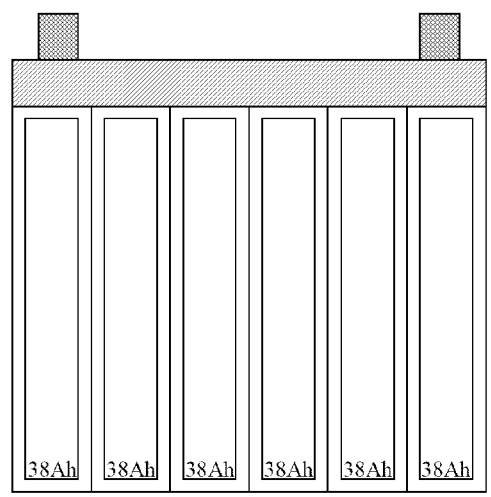
FIG. 4B is a diagram illustrating a situation before deterioration of cells of a secondary battery progresses equally.

As illustrated in FIG. 4A, for example, when the secondary battery 14 where capacitances of all cells are each 40 Ah in a new article is an estimation target, and the capacitance of all cells deteriorates to 38 Ah as illustrated in FIG. 4B, for example, due to use thereof. In such a case, the deterioration of the secondary battery 14 can be accurately estimated through the expression (1) because all cells equally deteriorate.

Figure 4C:
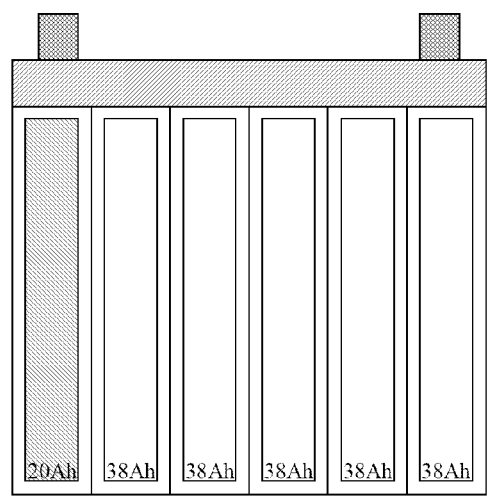
FIG. 4C is a diagram illustrating a progress state of deterioration of cells of the secondary battery unbalanced.

However, as illustrated in FIG. 4C, when only a cell at a left end deteriorates to 20 Ah and other cells deteriorate to 38 Ah, the SOH is controlled by an effect of the left end cell which deteriorates the most. Since the equivalent circuit illustrated in FIG. 3 is an equivalent circuit whose target is all cells of the secondary battery 14, the effect of the most deteriorated cell at the left end is averaged even under the deterioration state as illustrated in FIG. 4C. Accordingly, when there is a variation in deterioration as illustrated in FIG. 4C, the SOH calculated by using the expression (1) is not accurate because the state of the most deteriorated cell at the left end is not sufficiently reflected.

More concretely, when the deterioration is estimated by using the equivalent circuit, since the estimated deterioration corresponds to an average capacitance of all cells, when a function to find an average value of six cells is expressed as, for example, ave( ), a value close to ave(20 Ah, 38 A, 38 Ah, 38 Ah, 38 Ah, 38 Ah)=35 Ah is estimated from the expression (1) in the case of FIG. 4C. Meanwhile, since an actual SOH depends on the most deteriorated cell, when a function to find a minimum value of six cells is expressed as min( ), a value of min(20 Ah, 38 A, 38 Ah, 38 Ah, 38 Ah, 38 Ah)=20 Ah becomes a value close to a real value in the case of FIG. 4C. In the case of FIG. 4B, the SOH found by the expression (1) becomes a value close to the real value because ave(38 Ah, 38 A, 38 Ah, 38 Ah, 38 Ah, 38 Ah)=38 Ah and min(38 Ah, 38 A, 38 Ah, 38 Ah, 38 Ah, 38 Ah)=38 Ah.

When the secondary battery 14 where there was a variation in deterioration among cells was examined, it turned out that a specific trend exists in a use method. That is, it became clear that there is the trend of occurrence of the variation in deterioration among cells when overcharge or over-discharge occurs, or charge and discharge are repeated in a short period as examples.

In this embodiment, the SOH is found by finding the components of the equivalent circuit illustrated in FIG. 3, and history of a use state of the secondary battery 14 is stored, to find the SOH based on the use history (history information). The SOH of the secondary battery 14 can be accurately found by referring to at least one of the above-stated methods according to a state of the secondary battery 14.

In more detail, a calculated amount of the method to find the SOH from the equivalent circuit is small. It has high accuracy when the deterioration of the secondary battery 14 does not proceed, the accuracy decreases as the deterioration proceeds, and in particular, the accuracy further decreases when there is a variation in deterioration among cells. Meanwhile, a calculated amount of the method to find the SOH from the use history is large. If the deterioration of the secondary battery 14 does not proceed, the accuracy is low, and the accuracy increases when the deterioration proceeds. When the accuracy is focused, it is possible to find the SOH based on the equivalent circuit when the secondary battery 14 does not deteriorate (for example, when the SOH is less than a predetermined threshold value), and to find the SOH based on the use history when the secondary battery 14 deteriorates (for example, the SOH is the predetermined threshold value or more) or there is a variation in deterioration among cells. Otherwise, the SOH can be found based on both methods. In more detail, the SOH found through one method can be corrected by the SOH through the other method or a coefficient. As an example, it is possible to calculate a parameter which is one when there is no variation in deterioration among cells, and a value becomes smaller as the variation among cells proceeds from the use history, and the SOH is multiplied by the parameter.

If the calculated amount is focused, the method finding the SOH by the equivalent circuit where the calculated amount is small may be used at a normal time, and the SOH may be found based on the history information in a special case (for example, the case when the variation among cells proceeds and the accurate SOH is required). It is possible to obtain the SOH with high accuracy and to reduce the calculated amount by using at least one of two methods.

Next, an example of more detailed operations of the embodiment of the present invention is explained with reference to FIG. 5.

In this embodiment, for example, at a timing when the discharge circuit 15 discharges the secondary battery 14 or at a timing when the engine 17 is started, the CPU 10a measures a voltage and a current of the secondary battery 14, and the components of the equivalent circuit illustrated in FIG. 3 are optimized through the learning processing or the fitting processing based on measured results. As the optimization method, for example, an optimum state vector X is estimated through an extended Kalman filter arithmetic operation, and adjustment parameters (components) of the equivalent circuit are updated to optimum ones from the estimated state vector X as it is described in Patent Publication No. 4532416. Concretely, a voltage drop ΔV when the secondary battery 14 is discharged at a predetermined current pattern is calculated based on the equivalent circuit using the adjustment parameters obtained from the state vector X under a certain state, and the state vector X is updated such that the voltage drop ΔV comes close to an actual measurement value. Then, the optimum adjustment parameters are calculated from the state vector X which is optimized by the update. It is also possible that a temporal change of the voltage value is obtained at a pulse discharge time of the secondary battery 14, and parameters of a predetermined function is calculated by performing fitting of the obtained change of the voltage value by using the predetermined function where time is set as a variable, and the components of the equivalent circuit of the secondary battery 14 are found based on the calculated parameters of the predetermined function, as it is described in WO2014/136593. The components of the equivalent circuit found as stated above are corrected to values under a standard state. For example, a state when the temperature is 25° C. and the SOC is 100% is set as the standard state. When the learning processing or the fitting processing is executed, the temperature and the SOC at that time are measured, and the components are corrected to values under the standard state. It is possible to find accurate values even when the learning or the fitting is executed in a different environment by performing the correction as stated above.

Rohm, Rct1, Rct2, C1, and C2 being the components of the equivalent circuit found as stated above are substituted into the expression (1) resulting in that the SOH based on the equivalent circuit can be obtained.

In this embodiment, the SOH is found based on the history of the use state of the secondary battery 14. For example, first parameters illustrated in FIG. 5 are obtained as the use history. In the example in FIG. 5, it is possible to use at least one of a running time of a vehicle (t_run), a stop time (t_stop), a charge time of the secondary battery 14 (t_chg), a discharge time (t_dischg), a quantity of charged electricity (Ah_chg), a quantity of discharged electricity (Ah_dischg), an internal resistance (R) of the secondary battery 14, an internal resistance (R) and a decreased mass of solution of an electrolytic solution (d_mass) as the first parameter.

An environmental temperature of an environment where the secondary battery 14 is used, a state of charge (SOC), a quantity of stratification, a quantity of polarization, and a charging/discharging current change every second. A progress state of deterioration of the secondary battery 14 differs depending on an environmental condition where the secondary battery 14 is used. For example, when the charge and discharge are repeated at a high environmental temperature, the progress of deterioration is faster compared to a case at a low environmental temperature. When the discharge is made in a low SOC, the progress of deterioration is faster compared to a case in a high SOC. Accordingly, the obtained use history is corrected in accordance with the use environment, the use history after the correction is cumulatively stored, and the SOH is calculated based on this use history in this embodiment.

In more detail, correction parameters A to H to correct respective parameters in a first parameter group in accordance with the use environment are calculated as illustrated in FIG. 5 in this embodiment. These correction parameters A to H are calculated by using at least one of a state of charge (SOC) of a secondary battery 2, a temperature (T_batt), a temperature difference (ΔT) between the environmental temperature and the temperature of the secondary battery T_batt, a quantity of stratification (q_st), a quantity of polarization (q_ov), and a current change rate (ΔI) per a predetermined time forming a second parameter group.

The newly detected parameters in the first parameter group are respectively multiplied by the correction parameters A to H, and the obtained values are cumulatively added to be stored. For example, in the case of the running time t_run being the use history, t_run_int is obtained by cumulatively adding a value of t_run×A which is obtained by multiplying the newly detected t_run by the correction parameter A calculated from the second parameter group obtained at that time. A similar process is executed for other first parameters.

The use history information obtained as stated above is substituted into an expression (2) illustrated below, resulting in that ΔSOH as a capacitance change rate showing a deterioration state can be obtained, and the SOH based on the use history is obtained by cumulatively adding ΔSOH and being multiplied by initial capacitance of the secondary battery 14. Here, w1 to w8 are weighting coefficients which are multiplied for the detected value of the first parameter after the correction and the cumulative value thereof, and they are preferably successively decided in accordance with properties and states of the secondary battery 14. There is a case when effects exerted on a degree of deterioration differ among parameters in the first parameter group depending on the state of charge and the properties of the secondary battery 14. By weighting the parameters in the first parameter group in accordance with such states and properties, the more accurate estimation of the deterioration state becomes possible. The weighting coefficients as stated above may be used by reading the weighting coefficients which are previously calculated and stored in the parameters 10ca in the RAM 10c in accordance with the kinds of the secondary battery 14, for example.

$$\Delta SOH = t\_run\_int \times w1 + t\_stop\_int \times w2 + t\_chg\_int \times w3 + t\_dischg\_int \times w4 + Ah\_chg\_int \times w5 + Ah\_dischg\_int \times w6 + R \times w7 + d\_mass \times w8 \quad (2)$$

Here, the accuracy of the SOH calculated based on the equivalent circuit is high when the deterioration of the secondary battery 14 does not proceed, but the accuracy becomes relatively low when the deterioration proceeds. In particular, the accuracy further decreases when there is a variation in deterioration among cells. Meanwhile, the accuracy of the SOH calculated based on the use history is low when the deterioration of the secondary battery 14 does not proceed, and the accuracy becomes high when the deterioration proceeds. The accuracy does not decrease even when there is a variation among cells.

Figure 6:
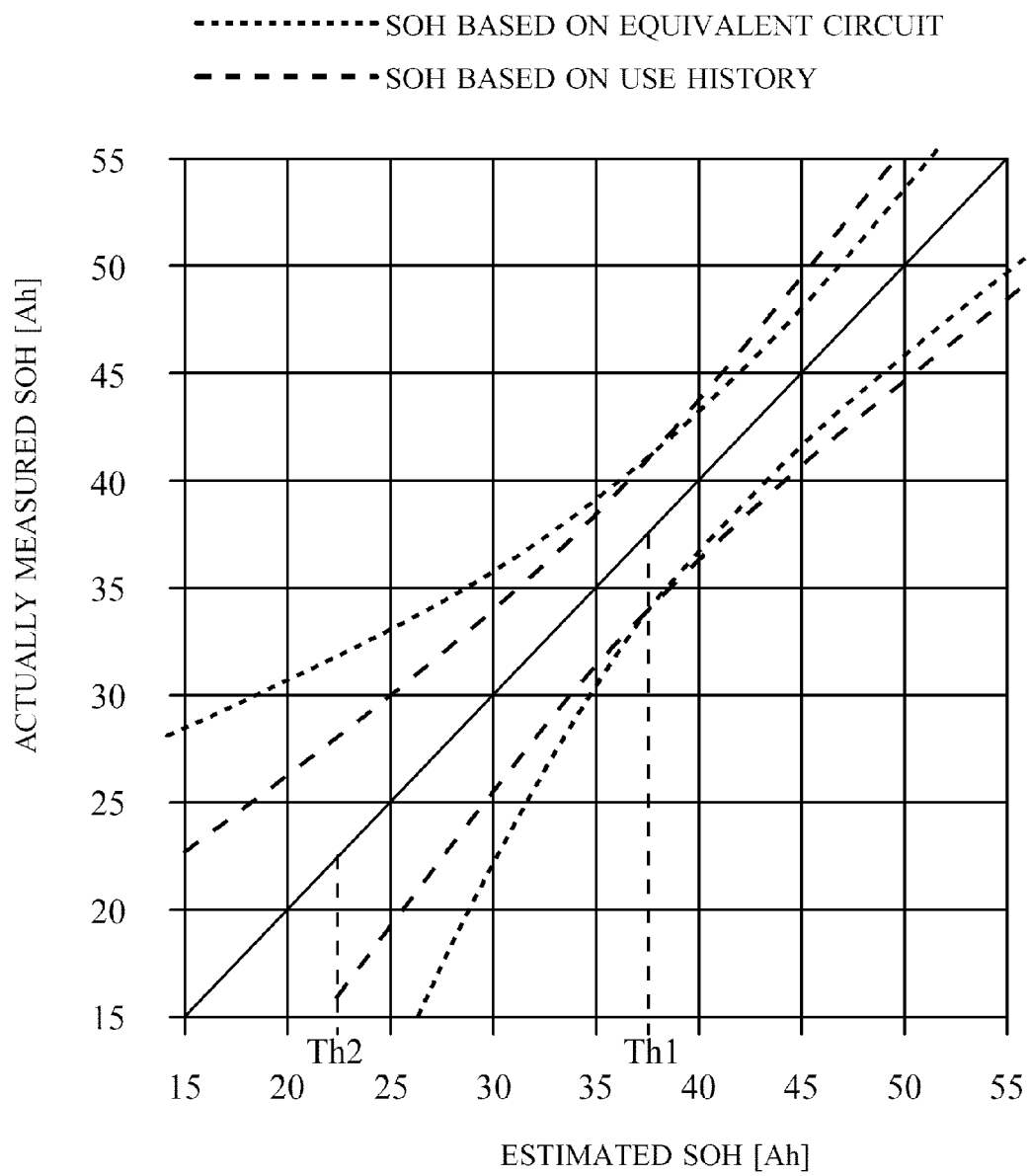
FIG. 6 is a schematic diagram to explain operations of the embodiment of the present invention.

These situations are schematically illustrated in FIG. 6. In FIG. 6, a region where an estimation error of the SOH calculate based on the equivalent circuit belongs is represented by two dotted-lines with short dashes, and a region where an estimation error of the SOH calculate based on the use history belongs is represented by two dotted-lines with long dashes. A horizontal axis in FIG. 6 shows the estimated SOH, and a vertical axis shows the actually measured SOH. In this chart, it is shown that the estimation accuracy becomes higher as a value comes close to a line segment of y=x. The accuracy of the SOH calculated based on the equivalent circuit is high because a distance between two dotted-lines with short dashes is near when the deterioration does not proceed (when the SOH is large), the accuracy decreases because the distance between the two dotted-lines is far when the deterioration proceeds, and the decrease in accuracy becomes obvious when there is a variation in deterioration among cells. Meanwhile, the accuracy of the SOH calculated based on the use history is low because the distance between the two dotted-lines with long dashes is far when the deterioration does not proceed (when the SOH is large), and the accuracy does not decrease much even when the deterioration proceeds because the distance does not change.

In this embodiment, the state of the secondary battery 14 is referred to, and when the deterioration of the secondary battery 14 does not proceed (for example, when the SOH calculated by the equivalent circuit is a predetermined threshold value Th1 or more), the deterioration state of the secondary battery 14 is determined by using the SOH calculated based on the equivalent circuit, and the deterioration state of the secondary battery 14 is determined by switching to the SOH calculated based on the use history when the deterioration of the secondary battery 14 proceeds (for example, when the SOH calculated by the equivalent circuit is less than the predetermined threshold value Th1). The estimation accuracy in total can be increased by using a region where the accuracy of each method is high. Otherwise, the occurrence of the variation in deterioration among cells which causes the decrease in the estimation accuracy of the SOH based on the equivalent circuit is detected based on the use history, and the SOH may be switched to the SOH based on the use history when it is determined that the variation occurs. When the secondary battery 14 where there was a variation in deterioration among cells was examined, it turned out that a specific trend exists in a use method. That is, it became clear that there is the trend of occurrence of the variation in deterioration among cells when overcharge or over-discharge occurs, or charge and discharge are repeated in a short period as examples. The SOH is therefore switched to the SOH based on the use history because it is determined that a probability where the variation occurs is high when there is the use history as stated above.

Next, an example of processes executed in the embodiment of the present invention is explained with reference to FIG. 7 to FIG. 9.

Figure 7:
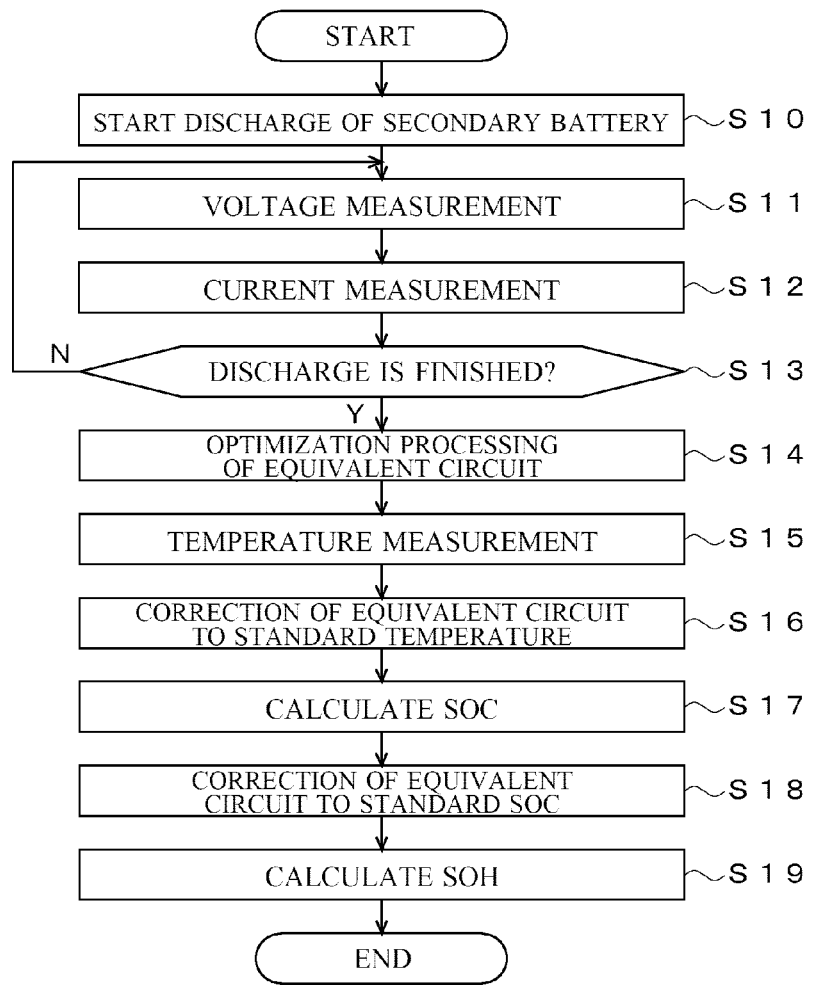
FIG. 7 is an example of a flowchart to explain a flow of processes executed in the embodiment illustrated in FIG. 1.

FIG. 7 is a flowchart executed when the equivalent circuit is learned. When the processing of the flowchart illustrated in FIG. 7 is started, the following steps are executed.

At Step S10, the CPU 10a starts the discharge of the secondary battery 14. For example, the CPU 10a discharges the secondary battery 14 by performing a switching control of the discharge circuit 15. Opportunities for discharging by means of the starter motor 18 may be used instead of the discharge circuit 15.

At Step S11, the CPU 10a measures the terminal voltage of the secondary battery 14 with reference to the output of the voltage sensor 11.

At Step S12, the CPU 10a measures the current flowing through the secondary battery 14 with reference to the output of the current sensor 12.

At Step S13, the CPU 10a determines whether the discharge is finished, and when it is determined to be finished (Step S13:Y), the process proceeds to Step S14, and in other cases (Step S13:N), the process returns to Step S11 to repeat the similar processes as stated above.

At Step S14, the CPU 10a executes optimization of each component of the equivalent circuit. As the optimization method, for example, the optimum state vector X is estimated through the extended Kalman filter arithmetic operation, and the adjustment parameters (components) of the equivalent circuit are updated to optimum ones from the estimated state vector X, as it is described in Patent Publication No. 4532416. Concretely, the voltage drop ΔV when the secondary battery is discharged in the predetermined current pattern is calculated based on the equivalent circuit using the adjustment parameters obtained from the state vector X under a certain state, and the state vector X is updated such that the voltage drop ΔV comes close to an actual measurement value. Then, the optimum adjustment parameters are calculated from the state vector X which is optimized by the update. It is also possible that a temporal change of the voltage value is obtained at a pulse discharge time of the secondary battery 14, and parameters of a predetermined function are calculated by making fitting of the obtained change of the voltage value by using the predetermined function where time is set as a variable, and the components of the equivalent circuit of the secondary battery 14 are found based on the calculated parameters of the predetermined function, as it is described in WO2014/136593.

At Step S15, the CPU 10a measures the temperature. In more detail, the CPU 10a measures the temperature of the secondary battery 14 in itself or a periphery thereof with reference to the output of the temperature sensor 13.

At Step S16, the CPU 10a corrects each component of the equivalent circuit which is optimized at Step S14 into a value at a standard temperature. For example, when the standard temperature is 25° C., the component is corrected to the value at the standard temperature by multiplying a correction coefficient corresponding to a difference value between, for example, the current temperature measured at Step S15 and 25° C. It goes without saying that the standard temperature may be the temperature other than 25° C.

At Step S17, the CPU 10a calculates the SOC of the secondary battery 14. For example, the SOC is calculated based on an OCV (open circuit voltage) of the secondary battery 14.

At Step S18, the CPU 10a corrects each component of the equivalent circuit which is optimized at Step S14 into a value at a standard SOC. For example, when the standard SOC is 100%, the component is corrected to the value at the standard SOC by multiplying a correction coefficient corresponding to a difference value between, for example, the current SOC calculated at Step S17 and 100%. It goes without saying that the standard SOC may be the value other than 100%.

At step S19, the CPU 10a obtains the SOH based on the equivalent circuit by substituting the components of the equivalent circuit after the correction by using the temperature and the SOC into the expression (1).

Next, processing to find the SOH from the history of the use state is explained with reference to FIG. 8. When the processing in a flowchart in FIG. 8 is started, the following steps are executed.

At Step S30, the CPU 10a stores cumulative parameters being respective parameters in the first parameter group which are cumulated at a previous period in the RAM 10c by every predetermined obtaining period defined by the programs 10ba and the like. In more detail, the CPU 10a stores a cumulative parameter t_run_int of the running time t_run until a previous period as t_run_pre. Similarly, respective values of the stop time t_stop, the charge time t_chg, the discharge time t_dischg, the quantity of charged electricity Ah_chg, and the quantity of discharged electricity Ah_dischg are stored in the RAM 10c as t_stop_pre, t_chg_pre, t_dischg_pre, Ah_chg_pre, and Ah_dischg_pre.

At Step S31, the CPU 10a receives information input from each sensor, to obtain latest measurement values of the running time t_run, the stop time t_stop, the charge time t_chg, the discharge time t_dischg, the quantity of charged electricity Ah_chg, the quantity of discharged electricity Ah_dischg, an internal resistance R, and a decreased mass of solution d_mass being respective parameters in the first parameter group.

At Step S32, the CPU 10a receives information input from each sensor to obtain latest measurement values of the state of charge SOC, the temperature T_batt, the temperature difference $\Delta T$ between the environmental temperature and the temperature of the secondary battery 14 T_batt, the quantity of stratification q_st, the quantity of polarization q_ov, and the current change rate $\Delta I$ being respective parameters in the second parameter group.

At Step S33, the CPU 10a calculates correction parameters A to H by using respective parameters in the second parameter group obtained at Step S32.

At Step S34, the CPU 10a performs correction of the obtained latest respective parameters in the first parameter group by using the correction parameters A to H. In more detail, the CPU 10a adds respective parameters of the running time t_run, the stop time t_stop, the charge time t_chg, the discharge time t_dischg, the quantity of charged electricity Ah_chg, and the quantity of discharged electricity Ah_dischg to be added to the respective parameters in the first parameter group at the previous period after the correction. For example, regarding the running time t_run of a vehicle, the latest cumulative parameter t_run_int is calculated by adding a value where t_run being the obtained latest value is multiplied by the correction parameter A to the cumulative parameter t_run_pre until the previous period. Similarly, the respective obtained latest measurement values t_stop, t_chg, t_dischg, Ah_chg, and Ah_dischg are respectively multiplied by the correction parameters B to F to calculate the cumulative parameters t_stop_int, t_chg_int, t_dischg_int, Ah_chg_int, and Ah_dischg_int.

Among the first parameters, the internal resistance R and the decreased mass of solution d_mass are not necessary to be cumulated by a predetermined period, and the correction is made by multiplying the latest value obtained at each estimation timing by the correction parameter.

The CPU 10a executes the processes of Steps S30 to S34 within a period of about, for example, 0.1 to 100 ms. These processes are repeatedly executed, resulting in that the first parameters are each appropriately kept in the latest state during running of the vehicle (a period from a drive start to end of the vehicle including a temporal stop state).

At Step S35, the CPU 10a calculates $\Delta$SOH by using the use history based on the expression (2). The SOH can be obtained by cumulatively adding the $\Delta$SOH calculated as stated above.

Figure 8:
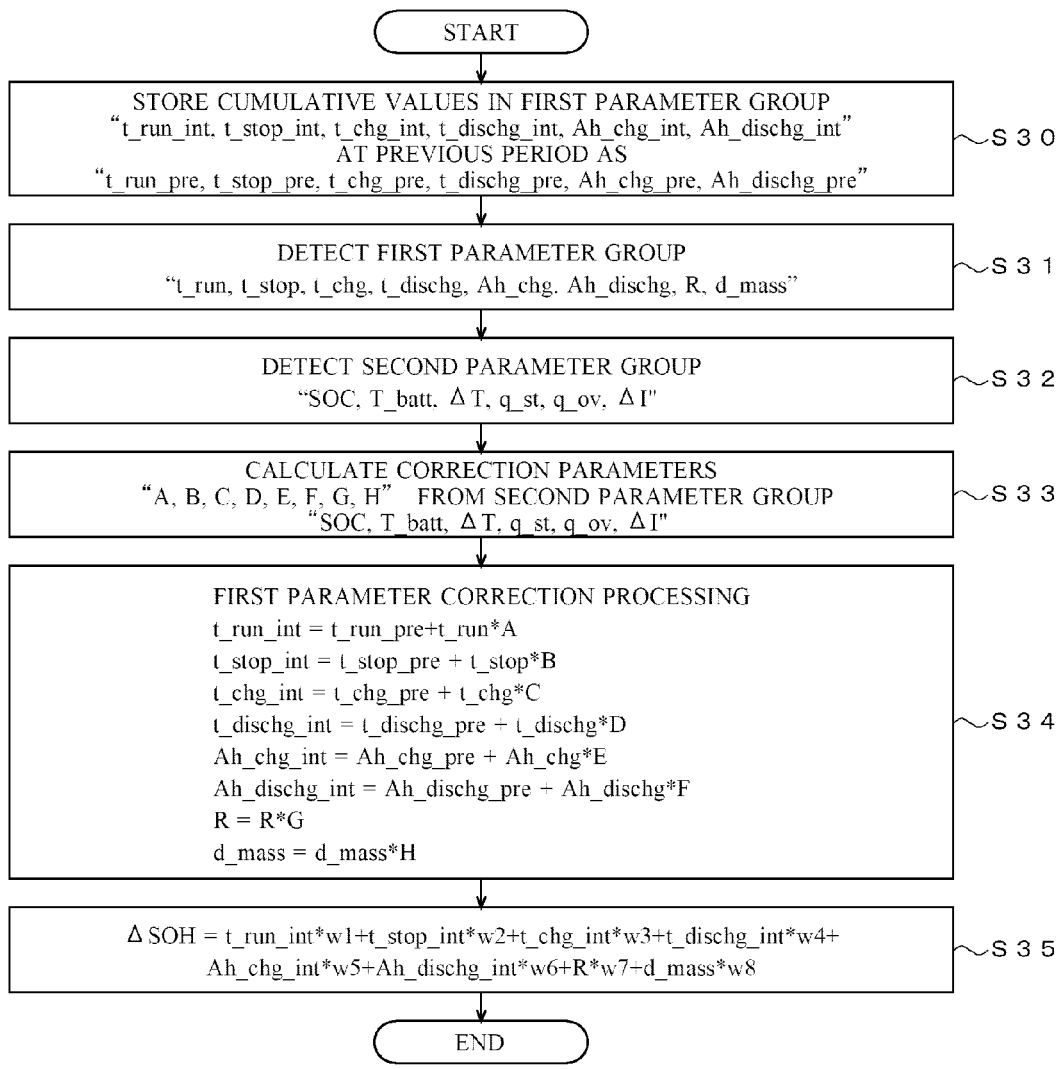
FIG. 8 is an example of a flowchart to explain a flow of processes executed in the embodiment illustrated in FIG. 1.
Figure 9:
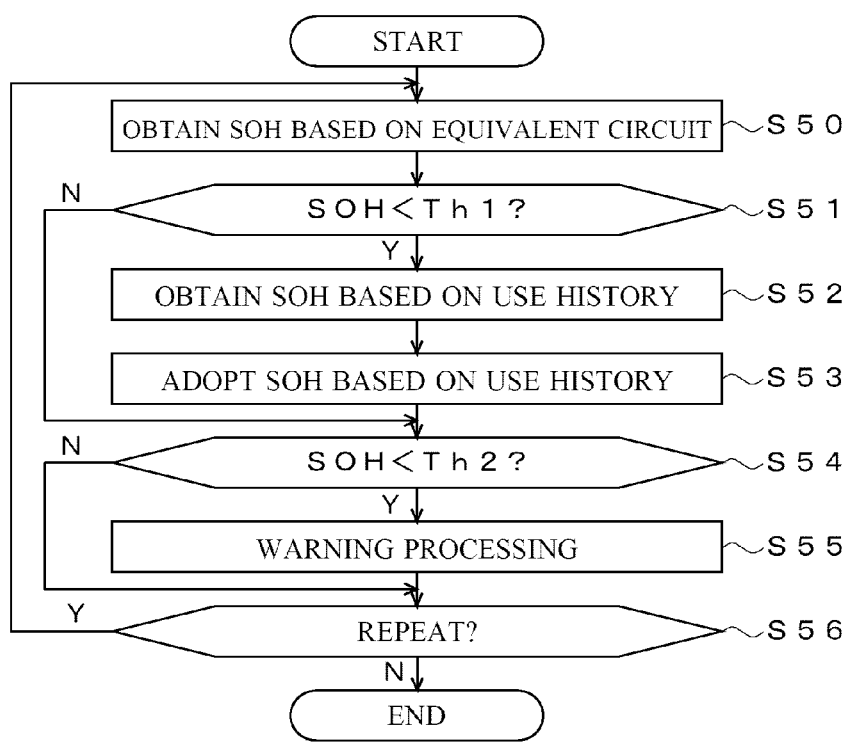
FIG. 9 is an example of a flowchart to explain a flow of processes executed in the embodiment illustrated in FIG. 1.

Next, there is described processing to determine the deterioration state of the secondary battery 14 by using the SOH based on the equivalent circuit obtained through the flowchart illustrated in FIG. 7 and the SOH based on the use history obtained through the flowchart illustrated in FIG. 8 with reference to FIG. 9. When the processing in a flowchart illustrated in FIG. 9 is started, the following steps are executed.

At Step S50, the CPU 10a obtains the SOH based on the equivalent circuit. In more detail, the CPU 10a obtains the SOH calculated by the process at Step S19 in FIG. 7 from the RAM 10c.

At Step S51, the CPU 10a determines whether the SOH based on the equivalent circuit obtained at Step S50 is less than the predetermined threshold value Th1, and when the SOH is less than the predetermined threshold value Th1 (Step S51: Y), the process proceeds to Step S52, and in other cases (Step S51: N), the process proceeds to Step S54. For example, as illustrated in FIG. 6, the point Th1 where the dotted-line with short dashes representing the SOH based on the equivalent circuit and the dotted-line with long dashes representing the SOH based on the use history intersect is used as a determination reference, and when the SOH based on the equivalent circuit becomes less than Th1, it is determined to be Y to proceed to Step S52. The threshold value Th1 is desirably set such that the value of the SOH does not largely change when the SOH to be referred to is switched based on a difference between both values without being limited to keep the accuracy. For example, a timing when the difference between the value of the SOH based on the equivalent circuit and the value of the SOH based on the use history becomes less than the predetermined threshold value is set to be the threshold value Th1, resulting in that fluctuation in a value at the switching time can be prevented. A time constant may be provided at the switching time so as not to largely change the estimation value in a short time.

At Step S52, the CPU 10a obtains the SOH based on the use history. In more detail, the CPU 10a obtains the SOH which is obtained by cumulatively adding $\Delta$SOH found by the process illustrated in Step S35 in FIG. 8.

At Step S53, the CPU 10a adopts the SOH based on the use history obtained at Step S52 instead of the SOH based on the equivalent circuit. When the SOH to be adopted is switched, the time constant may be used to moderately change an output value so as to prevent that the output value largely fluctuates as stated above, or the estimation values with each other may be set so as not to largely change.

At Step S54, the CPU 10a determines whether the SOH is less than a predetermined threshold value Th2, and when it is determined that the SOH is less than the predetermined threshold value Th2 (Step S54: Y), the process proceeds to Step S55, and in other cases (Step S54: N), the process proceeds to Step S56. In more detail, when it is determined that SOH<Th1 at Step S51, the SOH based on the use history is adopted, and the SOH and the threshold value Th2 (for example, Th2 (<Th1) illustrated in FIG. 6 can be used) are compared. When it is determined that SOH<Th1, the deterioration estimation can be accurately performed based on the SOH with high accuracy since the accuracy of the SOH based on the use history is higher than that of the SOH based on the equivalent circuit. When it is determined that SOH≥Th1 at Step S51, the SOH based on the equivalent circuit is adopted and the SOH and the threshold value Th2 are compared. When it is determined that the SOH≥Th1, the accurate deterioration estimation can be performed based on the SOH with high accuracy since the accuracy of the SOH based on the equivalent circuit is higher than that of the SOH based on the use history.

At Step S55, the CPU 10a executes warning processing. For example, the CPU 10a notifies a higher device that the SOH decreases through the communication part 10d. As a result, the higher device issues a warning to an operator. For example, an alarm issuing a warning sound can be used as an output circuit as a method issuing the warning. In addition, for example, a text data or an image data indicating that the secondary battery 14 deteriorates may be displayed on a display as an output circuit.

At Step S56, the CPU 10a determines whether the processes are to be repeated, and when it is determined to repeat the process (Step S56: Y), the process returns to Step S50 to repeat the similar processes as the above-stated case, and in other cases (Step S56: N), the processes are finished.

According to the above processes, the operations described with reference to FIG. 3 to FIG. 6 are enabled.

(C) Explanation of Modified Embodiment

The embodiment described hereinabove is an example, and it goes without saying that this invention is not limited to the above-stated cases. For example, in the above-stated embodiment, the equivalent circuit illustrated in FIG. 3 is used, but other equivalent circuits may be used. For example, in FIG. 3, parallel elements of Rct1 and C1, and parallel elements of Rct2 and C2 are included to correspond to a positive electrode and a negative electrode, but an equivalent circuit may include either one of the parallel elements. An equivalent circuit where three or more parallel elements are connected may be used. Further, an equivalent circuit formed of only the internal resistance R may be used.

In the expression (1) used in the above embodiment, all of Rohm, Rct1, Rct2, C1, C2 are used as variables of the function on the right side, but for example, at least one or more of them may be used. Further, when the equivalent circuit including either ones of the parallel elements of Rct1 and C1, or the parallel elements of Rct2 and C2 are used as described above, at least one of these parallel elements may be used. In the case of the equivalent circuit where the three or more parallel elements are connected, a part of the parallel elements may be used.

In the expression (1) used in the above embodiment, values of Rohm, Rct1, Rct2, C1, C2 are used as the variables of the function on the right side, but a value of change or a rate of change from a predetermined time (for example, the time when the secondary battery 14 is mounted on the vehicle) of all of or a part of the components may be used.

In the above embodiment, the first parameter group illustrated in FIG. 4 is used by being corrected with the second parameter group as the use history, but other parameters may be used. For example, values, where the quantity of charged electricity, the quantity of discharged electricity, the charge time, and the discharge time are stratified by the SOC may be used. For example, a range from "0" (zero) to 100% of the SOC is stratified by every 10%, the quantity of charged electricity, the quantity of discharged electricity, the charge time, or the discharge time in each range of the SOC is stored, a value in each layer is multiplied by the weighting coefficient, and the SOH may be found from the obtained value. The stratification may be made by using not the SOC but the voltage, the temperature, and the current of the secondary battery 14.

Information regarding the use history for a relatively long period where the effect of the variation in deterioration among cells of the secondary battery 14 is shown is preferably used as the history of the use state. For example, information regarding not only the latest one driving but also a plurality of times of drivings are preferably included, and information for a long period regarding the history of the use state from the time when the use of the secondary battery 14 is started is more preferable.

In the above embodiment, the SOH based on the equivalent circuit or the use history is selected according to the value of the SOH based on the equivalent circuit, but for example, they may be selected according to the value of the SOH based on the use history. Otherwise, the SOHs may be selected according to whether a use time of the secondary battery 14 exceeds a predetermined threshold value. For example, when the use time of the secondary battery 14 exceeds the predetermined threshold value, the SOH may be changed from the SOH based on the equivalent circuit to the use history.

There is a case when the OCV (open circuit voltage) of the secondary battery 14 increases/decreases if the secondary battery 14 deteriorates. That is, when water in the electrolytic solution of the secondary battery decreases, an electrolytic solution concentration increases, resulting in that there is a possibility of increasing of the OCV even under the same SOC. Meanwhile, for example, in the lead-acid battery, when sulfation (crystallization of an active material $(PbSO_4)$ after an electrochemical reaction) occurs, the electrolytic solution concentration decreases, resulting in that there is a possibility of decreasing in the OCV even under the same SOC. Accordingly, for example, when a value of the OCV is larger than a predetermined threshold value, or smaller than the predetermined threshold value, the SOH may be changed from the SOH based on the equivalent circuit to the use history. Since a voltage drop when the starter motor 18 is rotated to start the engine 17 becomes larger as the secondary battery 14 deteriorates, the SOH may be selected by comparing the voltage drop when the starter motor 18 is rotated to start the engine 17 with a predetermined threshold value. Concretely, for example, when the voltage drop becomes larger than the predetermined threshold value, the SOH may be changed from the SOH based on the equivalent circuit to the use history.

In the flowchart illustrated in FIG. 9, the SOH based on the equivalent circuit or the use history is selected in accordance with the value of the SOH based on the equivalent circuit, but a selection destination may be changed in accordance with the variation in deterioration among cells of the secondary battery 14. Concretely, when the use state has high possibility of occurrence of variation in deterioration among cells in (for example, when the secondary battery is discharged for a long time or the charge and discharge are repeated in the low SOC, or when the secondary battery is charged for a long time or a charge capacity is large in the high SOC, or when a change in an atmospheric temperature of the secondary battery 14 is severe), it is determined to be Y at Step S51, and the process proceeds to Step S52 to refer to the SOH based on the use history.

The secondary battery 14 has a configuration having a plurality of cells as illustrated in FIG. 4, but for example, it may be formed by serially connecting a plurality of independent secondary batteries.

EXPLANATION OF REFERENCE SINGS 1 secondary battery deterioration estimation device
10 control part (finding unit, first estimation unit, second estimation unit, determination unit)
10a CPU
10b ROM
10c RAM (storage unit)
10d communication part
10e I/F
11 voltage sensor
12 current sensor
13 temperature sensor
14 secondary battery
15 discharge circuit
16 alternator
17 engine
18 starter motor
19 load

The invention claimed is:

1. A secondary battery deterioration estimation device estimating deterioration of a secondary battery, comprising:
a processor; and
a memory that stores executable instructions that, when executed by the processor, facilitate performance of operations, comprising:
receiving a first signal representing a discharging voltage from a voltage detector;
receiving a second signal representing a discharging current from a current detector;
calculating values of elements forming an equivalent circuit of the secondary battery;
calculating a state of health (SOH) of the secondary battery based on the values of the elements forming the equivalent circuit;
generating history information showing history of a use state of the secondary battery;
calculating the SOH of the secondary battery based on the history information;
determining a deterioration state of the secondary battery with reference to at least one of the SOH calculated by the values of the elements or the SOH calculated by the history information in accordance with a state of the secondary battery;
in response to determining that a value of the SOH based on the values of the elements forming the equivalent circuit or the SOH calculated by the history information has fallen below a threshold value, switching the SOH to be referred to in accordance with the deterioration state of the secondary battery; and
outputting data representing the deterioration state of the secondary battery.

2. The secondary battery deterioration estimation device according to claim 1, wherein the operations further comprise:
determining the deterioration state of the secondary battery with reference to the SOH calculated by the values of the elements when the secondary battery is a new article, and the SOH calculated by the history information when the secondary battery deteriorates.

3. The secondary battery deterioration estimation device according to claim 2, wherein the operations further comprise:
selecting the SOH calculated by the history information as a reference destination when it is determined that the secondary battery deteriorates based on the values of the elements forming the equivalent circuit or the history information.

4. The secondary battery deterioration estimation device according to claim 3, wherein the operations further comprise:
switching the reference destination from the SOH calculated by the values of the elements to the SOH calculated by the history information when it is determined that there is a variation in deterioration among cells of the secondary battery.

5. The secondary battery deterioration estimation device according to claim 1, wherein the operations further comprise:
determining the deterioration state of the secondary battery through correction of the SOH calculated by the values of the elements with the SOH calculated by the history information.

6. The secondary battery deterioration estimation device according to claim 5, wherein the operations further comprise:
correcting the SOH calculated by the values of the elements based on the SOH calculated by the history information when it is determined that the secondary battery deteriorates based on the SOH calculated by the values of the elements.

7. The secondary battery deterioration estimation device according to claim 1, wherein the operations further comprise:
generating information showing charge and discharge of the secondary battery based on a signal from a current sensor which detects a current flowing through the secondary battery, and calculates the SOH based on the generated history information.

8. The secondary battery deterioration estimation device according to claim 7, wherein the secondary battery is mounted on a vehicle, and wherein the operations further comprise:
detecting a running time and a stop time of the vehicle;
generating the history information with reference to the detected running time and stop time; and
calculating the SOH based on the generated history information.

9. The secondary battery deterioration estimation device according to claim 8, wherein the operations further comprise:
detecting an internal resistance and a decreased mass of solution of the secondary battery;
generating the history information with reference to the detected internal resistance and the decreased mass of solution; and
calculating the SOH based on the generated history information.

10. The secondary battery deterioration estimation device according to claim 1, wherein the secondary battery is mounted on a vehicle, and wherein the operations further comprise:
detecting and setting at least one of a running time and a stop time of the vehicle, and a charge time, a discharge time, a charge amount, a discharge amount, an internal resistance, and a decreased mass of solution of the secondary battery as a first parameter;
detecting and setting at least one of a state of charge, an internal temperature, a temperature difference between an environmental temperature and the internal temperature, a quantity of stratification, a quantity of polarization, and a current change rate per a unit time as a second parameter;
calculating a correction coefficient based on the second parameter;
correcting the first parameter by using the correction coefficient; and
calculating the SOH based on multiplying the corrected first parameter by a weighting coefficient.

11. The secondary battery deterioration estimation device according to claim 1, wherein the operations further comprise:
outputting a warning when a value of the SOH obtained is smaller than a predetermined threshold value.

12. A secondary battery deterioration estimation device estimating deterioration of a secondary battery, comprising:
a unit which calculates values of elements forming an equivalent circuit of the secondary battery;

a unit which calculates a state of health (SOH) of the secondary battery based on the values of the elements forming the equivalent circuit;
a unit which generates history information showing history of a use state of the secondary battery;
a unit which calculates the SOH of the secondary battery based on the history information;
a unit which determines a deterioration state of the secondary battery with reference to at least one of the SOH calculated by the values of the elements or the SOH calculated by the history information in accordance with a state of the secondary battery; and
a unit which, in response to determining that a value of the SOH based on the values of the elements forming the equivalent circuit or the SOH calculated by the history information has fallen below a threshold value, switches the SOH to be referred to in accordance with the deterioration state of the secondary battery.

13. A secondary battery deterioration estimation method estimating deterioration of the secondary battery, comprising:
receiving, by a programmable processor connected to a voltage sensor detecting a discharging voltage of the secondary battery and to a current sensor detecting a discharging current of the secondary battery, a first signal representing the discharging voltage from the voltage sensor;
receiving, by the programmable processor, a second signal representing the discharging current from the current sensor;
calculating, by the programmable processor, values of elements forming an equivalent circuit of the secondary battery based on the first and second signals;
calculating, by the programmable processor, a state of health (SOH) of the secondary battery based on the values of the elements forming the equivalent circuit;
generating, by the programmable processor, history information showing history of a use state of the secondary battery;
calculating, by the programmable processor, the SOH of the secondary battery based on the history information;
determining, by the programmable processor, a deterioration state of the secondary battery with reference to at least one of the SOH calculated by the values of the elements or the SOH calculated by the history information in accordance with a state of the secondary battery;
in response to determining, by the programmable processor, that a value of the SOH based on the values of the elements forming the equivalent circuit or the SOH calculated by the history information has fallen below a threshold value, switching the SOH to be referred to in accordance with the deterioration state of the secondary battery; and
outputting, by the programmable processor, data representing the deterioration state of the secondary battery.

14. The secondary battery deterioration estimation device according to claim 1, wherein the operations further comprise:
performing the switching of the SOH to be referred to in accordance with the state of the secondary battery when it is determined that there is a variation in deterioration among cells of the secondary battery.

15. The secondary battery deterioration estimation device according to claim 12, wherein:
the unit which switches the SOH to be referred to in accordance with the state of the secondary battery performs the switching when it is determined that there is a variation in deterioration among cells of the secondary battery.

16. The secondary battery deterioration estimation device according to claim 15, wherein:
the unit which determines the deterioration state of the secondary battery performs the determining with reference to the SOH calculated by the values of the elements when the secondary battery is a new article, and the SOH calculated by the history information when the secondary battery deteriorates.

17. The secondary battery deterioration estimation device according to claim 15, wherein
the unit which switches the SOH to be referred to in accordance with the state of the secondary battery selects the SOH calculated by the history information as a reference destination when it is determined that the secondary battery deteriorates based on the values of the elements forming the equivalent circuit or the history information.

18. The secondary battery deterioration estimation method according to claim 13, further comprising:
performing, by the programmable processor, the switching of the SOH to be referred to in accordance with the state of the secondary battery when it is determined that there is a variation in deterioration among cells of the secondary battery.

19. The secondary battery deterioration estimation method according to claim 18, wherein:
performing, by the programmable processor, the determining of the deterioration state of the secondary battery with reference to the SOH calculated by the values of the elements when the secondary battery is a new article, and the SOH calculated by the history information when the secondary battery deteriorates.

20. The secondary battery deterioration estimation method according to claim 18, wherein
selecting, by the programmable processor, the SOH by the history information as a reference destination when it is determined that the secondary battery deteriorates based on the values of the elements forming the equivalent circuit or the history information.

* * * * *